United States Patent
Torashima et al.

(10) Patent No.: US 8,081,366 B2
(45) Date of Patent: Dec. 20, 2011

(54) OSCILLATING DEVICE, LIGHT DEFLECTOR, AND IMAGE FORMING APPARATUS USING THE SAME

(75) Inventors: Kazutoshi Torashima, Irvine, CA (US); Takahisa Kato, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 613 days.

(21) Appl. No.: 12/174,890

(22) Filed: Jul. 17, 2008

(65) Prior Publication Data
US 2009/0185248 A1 Jul. 23, 2009

(30) Foreign Application Priority Data

Jul. 30, 2007 (JP) ................................. 2007-197394

(51) Int. Cl.
*G02B 26/08* (2006.01)
(52) U.S. Cl. .............................. 359/224.1; 257/E21.599
(58) Field of Classification Search .... 359/196.1–226.3, 359/290–295, 838, 846, 871, 872; 250/204, 250/559.06, 559.29, 230, 234; 347/255–260; 353/39, 98–99; 385/15–18, 22; 398/12, 398/19, 45; 257/E21.599, E21.6; 438/406, 438/455; 248/560; 310/66
See application file for complete search history.

(56) References Cited

U.S. PATENT DOCUMENTS

| | | | |
|---|---|---|---|
| 4,317,611 A | 3/1982 | Petersen | 350/6.6 |
| 5,740,150 A | 4/1998 | Uchimaru et al. | 369/119 |
| 2006/0198006 A1* | 9/2006 | Kato et al. | 359/224 |
| 2009/0034038 A1* | 2/2009 | Torashima et al. | 359/198 |

FOREIGN PATENT DOCUMENTS

| | | |
|---|---|---|
| EP | 1 275 997 A2 | 1/2003 |
| JP | 2003-019700 A | 1/2003 |

OTHER PUBLICATIONS

Translation of JP 2003019700 (Jan. 21, 2003).*
U.S. Appl. No. 12/174,880, filed Jul. 17, 2008.
Madou, Marc J., "Fundamentals of Microfabrication: The Science of Miniaturization," Second Edition, CRC Press, 2002, pp. 185-195.

* cited by examiner

*Primary Examiner* — Jennifer L. Doak
(74) *Attorney, Agent, or Firm* — Fitzpatrick, Cella, Harper & Scinto (57) ABSTRACT

An oscillating device includes a supporting portion, a movable portion, a torsion spring that supports the movable portion with respect to the supporting portion so that the movable portion is capable of torsionally vibrating around a torsion axis, and a driving unit that vibrates the movable portion. The torsion spring is formed of single-crystal silicon, and a crystal orientation parallel to the torsion axis of the torsion spring is a [111] orientation.

6 Claims, 6 Drawing Sheets

OSCILLATING DEVICE, LIGHT DEFLECTOR, AND IMAGE FORMING APPARATUS USING THE SAME

BACKGROUND OF THE INVENTION

1. Field of the Invention

The present invention relates to an oscillating device, making use of a torsion spring that elastically supports a member capable of vibrating torsionally, a light deflector, and an optical apparatus, such as an image forming apparatus, using the same. The light deflector is suitably used in an image forming apparatus, such as a digital copying machine or a laser beam printer using an electrophotography process, or a projection display that projects an image by light deflection and scanning.

2. Description of the Related Art

Very small mechanical members, which are manufactured from a silicon substrate by a semiconductor process, can be processed on the order of micrometers. Various very small functional elements are realized using these very small mechanical members. In particular, compared to a light-scanning optical system using, for example, a rotatable polygonal mirror, a light deflector that torsionally vibrates a reflecting surface with a micro torsion spring (formed by such a technology) can be reduced in size, and consumes little electricity.

Figure 7:
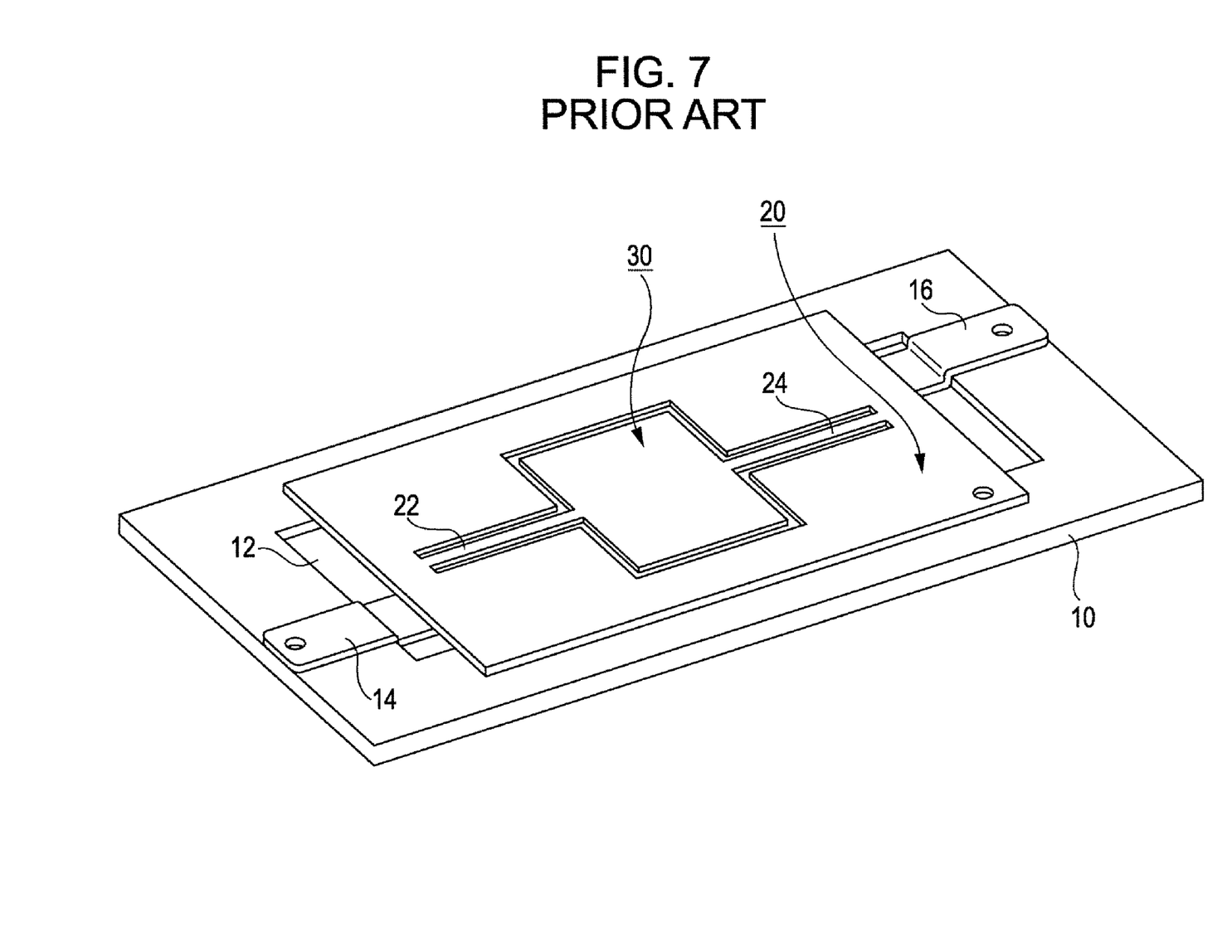
FIG. 7 is a perspective view of a related art.

An example of a light deflector formed of silicon is shown in FIG. 7 (refer to U.S. Pat. No. 4,317,611). FIG. 7 is a perspective view of the entire light deflector.

The light deflector shown in FIG. 7 includes a supporting portion 20, a movable portion 30, and torsion springs 22 and 24 supporting the movable portion 30 at the supporting portion 20 so that it can torsionally vibrate with respect to the supporting portion 20. The light deflector is formed by performing an etching technology and photolithography of a semiconductor producing method on a silicon wafer.

However, when an oscillating device is manufactured from a single-crystal silicon substrate by a semiconductor process such as that discussed in U.S. Pat. No. 4,317,611, variations may occur in the spring constant of the torsion springs. The variations in the spring constant cause, for example, variations in the resonant frequency of the oscillating device.

SUMMARY OF THE INVENTION

The present invention makes it possible to restrict variations in a spring constant, caused by variations in processing a single-crystal silicon substrate, and an oscillating device that uses a torsion spring.

According to the present invention, there is provided an oscillating device including a supporting portion, a movable portion, a torsion spring that supports the movable portion with respect to the supporting portion so that the movable portion is capable of torsionally vibrating around a torsion axis, and a driving unit that vibrates the movable portion. The torsion spring is formed of single-crystal silicon, and a crystal orientation parallel to the torsion axis of the torsion spring is a [111] orientation.

According to the present invention, when forming a torsion spring using single-crystal silicon, a crystal orientation, which is parallel to the torsion axis, is set to the [111] orientation. Therefore, compared to when other crystal planes or crystal orientations are used, a torsion spring constant ratio can be reduced. Consequently, when torsion springs having the same torsion spring constant are formed, the shapes of the torsion springs can be larger than those when other crystal planes or crystal orientations are used. Thus, variations in the spring constant of the torsion springs, caused by processing variations in a semiconductor process, can be made small. Also, by using the torsion springs in the oscillating device, variations in the resonant frequency of the oscillating device, caused by variations in the spring constant of the torsion springs, can be reduced.

Further features of the present invention will become apparent from the following description of exemplary embodiments with reference to the attached drawings.

DESCRIPTION OF THE EMBODIMENTS

Figure 1A:
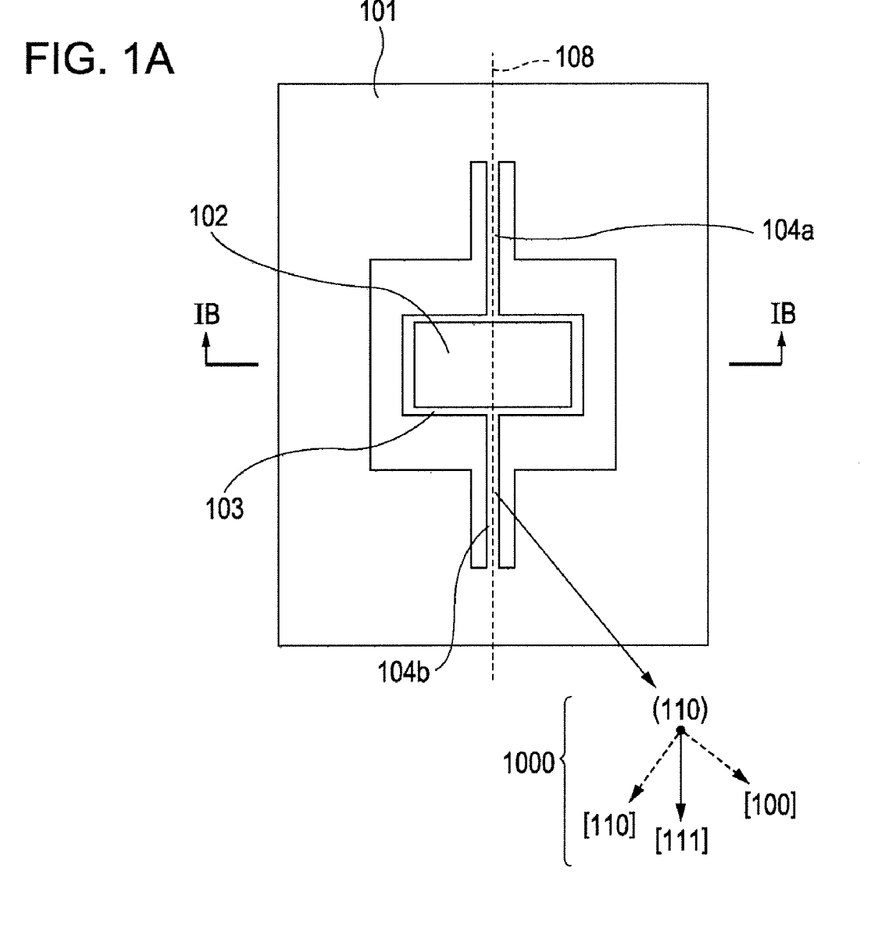
FIG. 1A is a top view of an oscillating device according to an embodiment of the present invention, and a light deflector according to a first embodiment of the present invention.
Figure 1B:
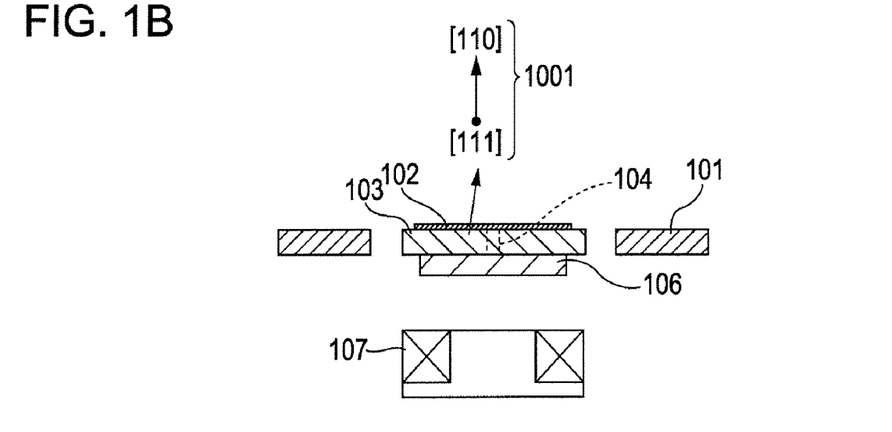
FIG. 1B is a sectional view of the oscillating device according to the embodiment of the present invention, and the light deflector according to the first embodiment of the present invention.

An embodiment of the present invention is depicted in FIGS. 1A and 1B, wherein FIG. 1A is a top view of an oscillating device according to the embodiment, and FIG. 1B is a sectional view taken along line IB-IB of FIG. 1A. The oscillating device according to the embodiment comprises a supporting portion 101, a movable portion 103, and torsion springs 104a and 104b. The torsion springs 104a and 104b elastically support the movable portion 103 at the supporting portion 101 so that the movable portion 103 can torsionally vibrate around a torsion axis. The supporting portion 101 is secured to a securing member, such as a supporting substrate, and does not move even if the movable portion 103 torsionally vibrates. When the oscillating device according to the embodiment is used as a light deflector, a reflecting surface 102 is formed at the movable portion 103. The reflecting surface 102 is formed of aluminum by vacuum evaporation. The reflecting surface 102 may be formed of a thin film of other materials, such as gold or copper, with a protective layer being formed on the thin film. Alternatively, the reflecting surface 102 may be formed of a dielectric multilayer film.

The oscillating device further comprises a driving unit that drives the movable portion 103, and a driving control unit (not shown). The driving unit may be a coil or a magnet when it is an electromagnetic type, an electrode when it is an electrostatic type, and a piezo element when it is a piezo type. For example, in the structure shown in FIG. 1B, the movable portion 103 includes a hard magnetic member (permanent magnet) 106, and is magnetized vertically (towards the left and right in FIG. 1B) with respect to a torsion axis 108. The hard magnetic member can be formed by, for example, sputtering or adhesion. By applying a current to a coil 107 (serving as the driving unit) from the driving control unit, a magnetic field is generated. This causes a torque to be applied to the movable portion 103, thereby making it possible to drive the oscillating device. If the current applied to the coil 107 is alternating current, the oscillating device can be driven by torsion vibration that is in accordance with the frequency of the alternating current. Further, when alternating current that is equivalent to the resonant frequency of the oscillating device according to the present invention is applied to the coil 107, the movable portion 103 can be caused to vibrate resonantly with low power consumption.

The torsion springs 104a and 104b are formed of a single-crystal silicon substrate. A crystal orientation, parallel to the torsion axis 108 of the torsion springs 104a and 104b, is a [111] orientation. The torsion springs, whose crystal orientation (parallel to the torsion axis 108) is a [111] orientation, are formed by dry etching the single-crystal silicon substrate whose (110) plane is a principal plane. Here, the [111] orientation also refers to orientations that are substantially the same as the [111] orientation, so that the crystal orientation of the torsion springs, parallel to the torsion axis, also refers to crystal orientations within ±10 degrees of the [111] orientation. Within this range, the spring constants are substantially the same. The crystal orientation may be equivalent orientations.

In the specification, planes equivalent to the (111) plane, such as a (−1−1−1) plane and a (−111) plane, will be called (111) equivalent planes (that is, {111} planes). In addition, orientations equivalent to the [111] orientation, such as a [−1−1−1] orientation and a [−111] orientation, will be called [111] equivalent orientations.

Figure 5:
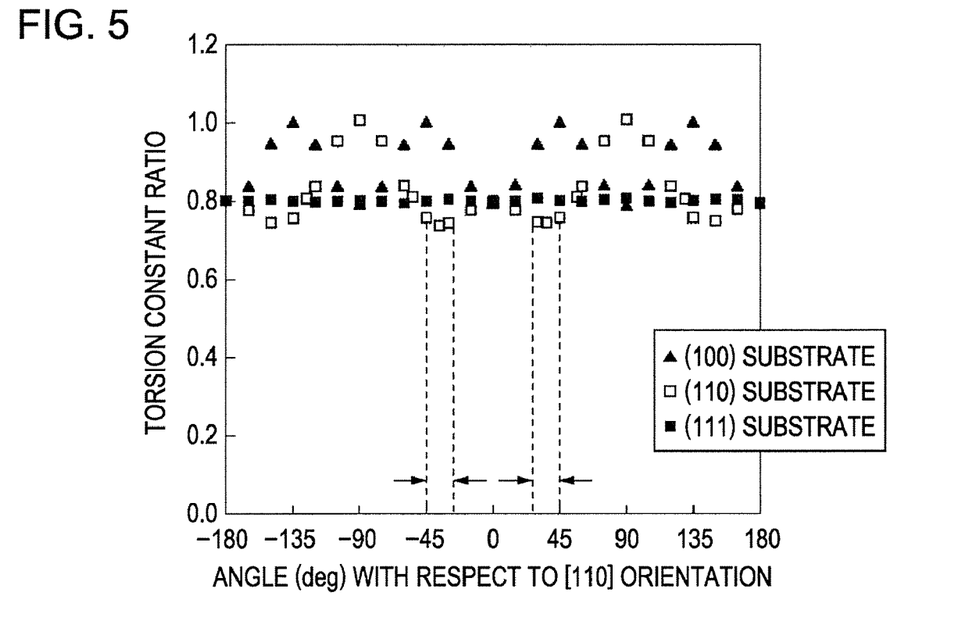
FIG. 5 is a graph illustrating how the spring constant of torsion springs in the present invention depends upon a crystal plane.

The principle of the embodiment will be understood from FIG. 5 which shows the results of a calculation of how a torsion spring constant ratio changes with respect to each crystal plane, using a finite element method. In a current calculation, crystal anisotropy of silicon is considered, and the shape of each torsion spring of a cross section perpendicular to the torsion axis is calculated as being a square. However, the shape of each torsion spring of the cross section perpendicular to the torsion axis need not be a square. For example, it may be rectangular.

Physical property values using the calculation of the finite element method are as follows. The density of silicon is 2300 kg/m$^3$. To consider the anisotropy of silicon single crystals, instead of Young's modulus (unit: Pa), the following stiffness modulus (unit: Pa) is used:

$$\text{Stiffness Coefficient} = \begin{pmatrix} C11 & C12 & C12 & 0 & 0 & 0 \\ C12 & C11 & C12 & 0 & 0 & 0 \\ C12 & C12 & C11 & 0 & 0 & 0 \\ 0 & 0 & 0 & C44 & 0 & 0 \\ 0 & 0 & 0 & 0 & C44 & 0 \\ 0 & 0 & 0 & 0 & 0 & C44 \end{pmatrix} \quad (1)$$

Here, C11=167.4 GPa, C12=65.23 GPa, and C44=79.57 GPa.

Using these physical property values, finite element models of, for example, the movable portion and the torsion springs are formed. By carrying out calculations by the finite element method, an analysis considering the crystal anisotropy can be carried out.

In FIG. 5, the vertical axis represents the torsion spring constant ratio, and the horizontal axis represents the angle formed with respect to the [110] orientation. The torsion spring constant ratio is a ratio in which a torsion spring constant is 1 when the torsion springs are formed using a (100) substrate and a crystal orientation parallel to the torsion axis is a [100] orientation (that is, when the angle formed with respect the [110] orientation in the (100) substrate shown in FIG. 5 is 45 degrees).

The angle formed with respect to the [110] orientation corresponds to an angle formed by the crystal orientation in the axial direction of each torsion spring with respect to the [110] orientation. Here, each torsion spring is formed using any single crystal silicon substrate. That is, zero degrees represents that the crystal orientation in the axial direction of each torsion spring is the [110] orientation. Here, the term "(100) substrate" represents that the crystal plane of the principal plane of the single-crystal silicon substrate (used to form each torsion spring) is a (100) plane. A (110) substrate and a (111) substrate can be similarly described. For example, for the (100) substrate, when the angles formed with respect to the [110] orientation are ±45 degrees and ±135 degrees, they represent the [100] orientation. When the angles formed with respect to the [110] orientation are 0 degrees, ±90 degrees, and ±180 degrees, they represent the [110] orientation. For the (110) substrate, the rotational angles of 0 degrees and ±180 degrees represent the [110] orientation. The rotational angle of ±90 degrees represents the [100] orientation, and the rotational angles of ±35.3 degrees and ±144.7 degrees represent the [111] orientation. For the (111) substrate, the rotational angles of 0 degrees and ±180 degrees represent the [110] orientation.

As shown in FIG. 5, the torsion spring constant using the (110) substrate is smaller than a smallest torsion spring constant of each torsion spring using the (100) and (111) substrates when the angle of the crystal orientation in the axial direction of each torsion spring with respect to the [110] orientation is in the range of from 0 degrees to 60 degrees. The smallest torsion spring constant ratio is represented by a certain torsion spring formed using the (110) substrate and whose crystal orientation in the torsion axial direction of each torsion spring is a [111] orientation. In this case, the angle with respect to the [110] orientation is 35.3 degrees. According to the embodiment, torsion springs of this orientation are used. The torsion spring constant at this time can be reduced by approximately 25% compared to a torsion spring constant in the (100) plane when the crystal orientation parallel to the torsion axis is a [100] orientation. In addition, when the angle is substantially in the [111] orientation (within the range of ±10 degrees of the [111] orientation), the spring constant ratios are substantially the same. The crystal orientation may be an equivalent orientation thereof.

Next, a torsion spring produced using a crystal orientation and a crystal plane having a small torsion spring constant ratio will be compared with a torsion spring produced using a crystal orientation and a crystal plane having a large torsion spring constant. When torsion springs having the same torsion spring constant are produced, the shapes of the torsion springs can be made large when they are formed in a crystal orientation and a crystal plane having a small torsion spring constant ratio than when the torsion springs are produced using a crystal plane having a large torsion spring constant ratio. For example, when the length of the torsion spring is constant, the width of the torsion spring can be made large when the torsion spring constant ratio is small. Also, when processing errors of single-crystal silicon substrates are the same, the influence of the processing errors on the torsion spring constant can be reduced when the shape of the torsion spring is thick. Therefore, the influence of the processing errors of the single-crystal silicon substrates can be reduced when the torsion springs are produced in a crystal orientation and a crystal plane having a small torsion spring constant ratio. By virtue of this structure, a change in the torsion spring constant, caused by the processing error regarding, for example, the width of the torsion spring, can be reduced. Therefore, variations in the resonant frequency of the oscillating device including torsion springs having small processing errors can be reduced.

Figure 6:
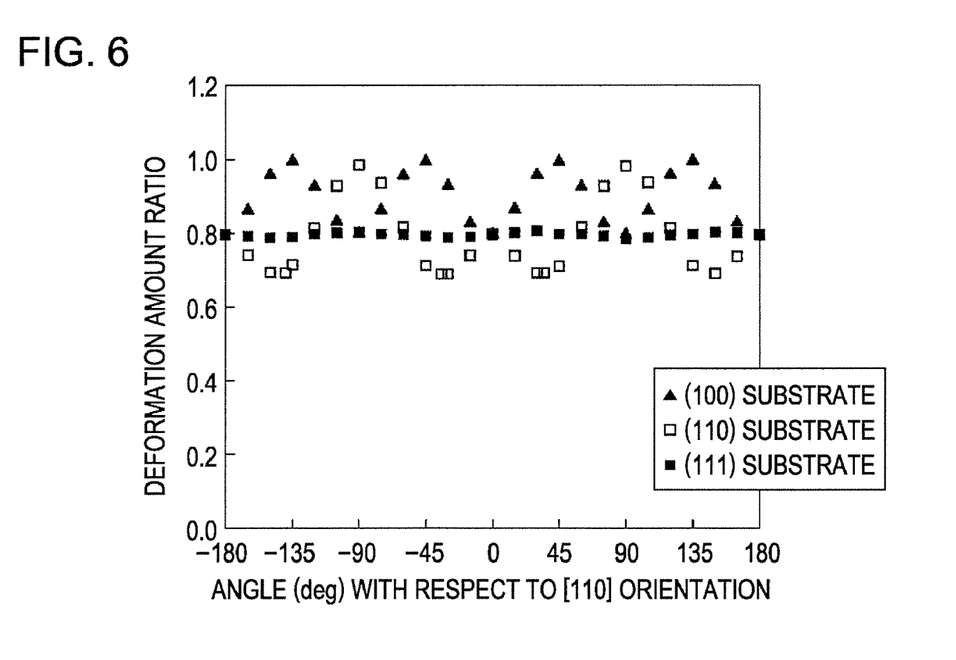
FIG. 6 is a graph illustrating how the amount of deformation of a movable portion according to the present invention depends upon a crystal plane.

Further, the movable portion may be formed of a single-crystal silicon substrate, and the crystal plane of the principal plane of the movable portion may be a (111) plane. When the movable portion torsionally vibrates within a predetermined angle, it receives a large angular acceleration. Therefore, the movable portion is flexed as a result of receiving an inertial force due to its own weight during driving. As shown in FIG. 6, the deformation amount of the movable portion, produced using the single-crystal silicon substrate having the (111) plane as the principal plane, is constant regardless of the angle with respect to the [110] orientation. Therefore, when the movable portion is produced, even if the crystal orientation of the movable portion is shifted, the deformation amount of the movable portion can be made substantially constant. Consequently, variations in the deformation amount of the movable portion, caused by processing errors, can be reduced.

After forming the movable portion separately from the torsion springs, it is integrated to the torsion springs by adhesion or joining. When the members of the oscillating device including, for example, the movable portion and the torsion springs are individually formed on a silicon wafer by a micromachining technology, unnecessary portions in the wafer can be reduced, so that usable portions can be increased. Therefore, costs can be reduced. In addition, since the specific gravity of silicon is small at approximately 2.3 g/cm$^3$, forming the movable portion using the single-crystal silicon substrate allows the movable portion to be driven at a high speed.

Further, the movable portion and the torsion springs can be integrally formed using single-crystal silicon. In this structure, since the processing can be carried out all at once using a semiconductor process technology having a high processing precision, a more highly precise oscillating device can be produced. Therefore, an oscillating device having little frequency variations can be provided.

Still further, a reflecting surface may be provided with the movable portion of the oscillating device. By virtue of this structure, the oscillating device can be used in a light deflector.

Still further, the oscillating device according to the embodiment can comprise a plurality of movable portions and a plurality of torsion springs that connect the plurality of movable portions so as to be capable of torsionally vibrating around a same torsion axis. Still further, at least one of the plurality of movable portions may have a reflecting surface, and a natural frequency serving as a reference frequency and a natural frequency which is an integral multiple of the reference frequency may be provided around the torsion axis. Still further, two or more natural oscillation modes in a torsion vibration direction may be excited at the same time to allow light scanning other than scanning with a sinusoidal light.

Still further, an image forming apparatus that includes a light source, a light deflector, and a photosensitive member, and that forms an electrostatic latent image as a result of the light deflector deflecting light from the light source and causing the photosensitive member to be irradiated by at least a portion of the light may be formed. In the structure using the light deflector including torsion springs having little spring constant variations, since variations in the resonant frequency, caused by processing errors, are small, a vertical-to-horizontal ratio of an image can be stabilized. Therefore, it is possible to prevent a reduction in image quality.

The present invention will hereunder be described in more detail with reference to specific embodiments.

First Embodiment

A structure of a light deflector according to a first embodiment will again be described with reference to FIGS. 1A and 1B. FIG. 1A is a top view of the light deflector according to the first embodiment, and FIG. 1B is a sectional view taken along line IB-IB of FIG. 1A. The light deflector according to the present invention comprises a supporting portion 101 and a movable portion 103 having a reflecting surface 102. In addition, the light deflector comprises torsion springs 104a and 104b that support the movable portion 103 at the supporting portion 101 so that they can torsionally vibrate with respect to the supporting portion 101. The length of each torsion spring is 5000 μm, and a cross-sectional shape perpendicular to a torsion axis 108 is a rectangular shape having a width of 150 μm and a thickness of 300 μm. The cross-sectional shape of each torsion spring perpendicular to the torsion axis need not be a rectangular shape, so that it may be a circular shape or a square. The supporting portion 101, the movable portion 103, and the torsion springs 104a and 104b are integrally formed by performing dry etching and photolithography of a semiconductor manufacturing method on a single-crystal silicon substrate including a (110) plane as a principal plane and having a thickness of 300 μm. The light deflector is produced so that a crystal orientation parallel to a torsion axis 108 of the torsion springs 104a and 104b is a [111] orientation.

A length of the movable portion 103 perpendicular to the torsion axis 10 is 3.0 mm, and a length thereof parallel to the torsion axis 108 is 1.0 mm. A thickness of the movable portion 103 is 0.3 mm. The shape of the movable portion is a rectangular parallelepiped shape, but may be, for example, an elliptical cylindrical shape. The reflecting surface 102 is formed of aluminum.

The light deflector also comprises a driving unit that drives the movable portion 103, and a driving control unit that controls the driving unit (not shown). In the embodiment, the driving unit is an electromagnetic driving unit. The movable portion 103 includes a hard magnetic member 106, and is magnetized perpendicularly to the torsion axis 108. The hard magnetic member can be formed by, for example, sputtering or adhesion. By applying a current to a coil 107, a magnetic field is generated. This causes a torque to be applied to the movable portion 103, thereby making it possible to drive the light deflector. If the current applied to the coil 107 is alternating current, the light deflector can be driven by torsion vibration that is in accordance with the frequency of the alternating current. The resonant frequency of the light deflector according to the present invention was 6500 Hz. By applying the alternating current, which is the same as the resonant frequency, to the coil 107, a torque is applied to the movable portion 103, so that the movable portion 103 can vibrate torsionally at an optical angle of 100 degrees with low power consumption.

By virtue of this structure, even if processing errors regarding the widths of the torsion springs 104a and 104b are on the order of 1 μm, the torsion spring constants can be substantially the same. Therefore, variations in the resonant frequency, caused by the processing errors, can be reduced to 1% or less.

Second Embodiment

Figure 2A:
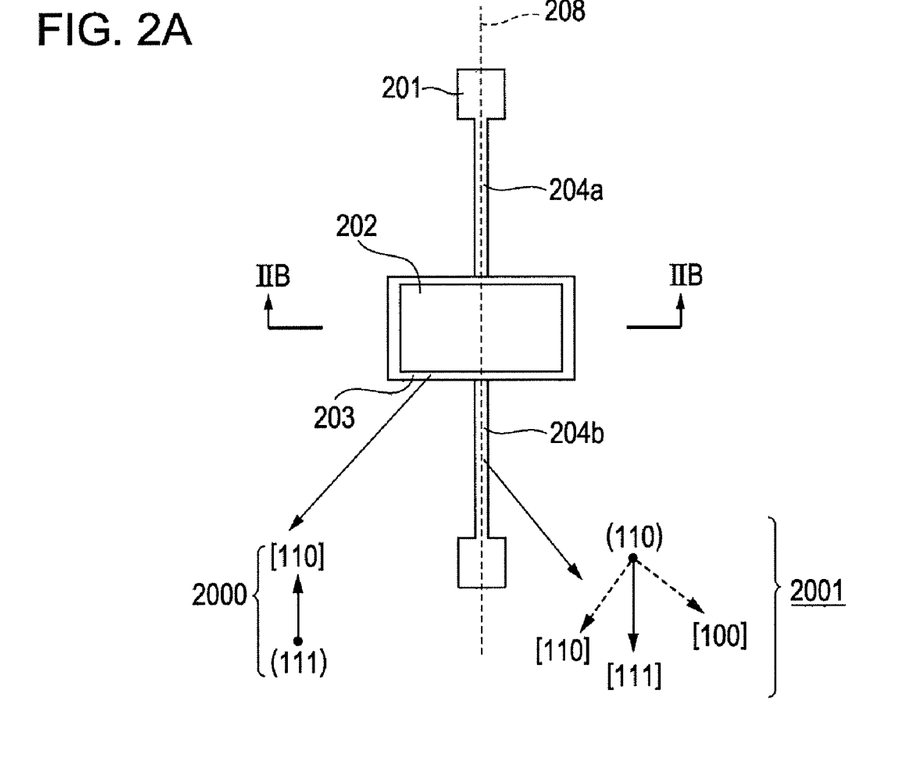
FIG. 2A is a top view of a light deflector according to a second embodiment of the present invention.
Figure 2B:
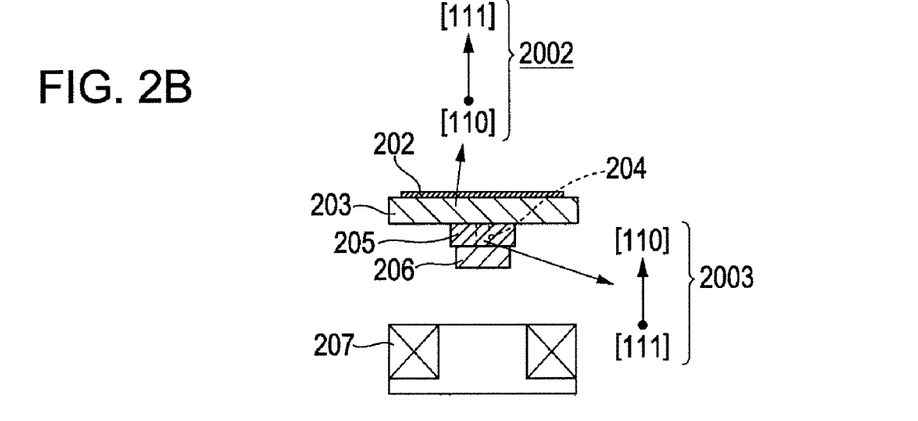
FIG. 2B is a sectional view taken along line IIB-IIB in FIG. 2A of the light deflector according to the second embodiment of the present invention.

The structure of a light deflector according to a second embodiment will be described with reference to FIGS. 2A and 2B. FIG. 2A is a top view of the light deflector according to the present invention. FIG. 2B is a sectional view taken along line IIB-IIB of FIG. 2A. The structure of the light deflector according to the second embodiment is substantially the same as the light deflector according to the first embodiment. In this embodiment, a movable portion 203 and torsion springs are formed as separate members, and, then, are integrated to each other.

Torsion springs 204a and 204b are formed by performing dry etching and photolithography of a semiconductor manufacturing method on a single-crystal silicon substrate including a (110) plane as a principal plane and having a thickness of 100 μm. A crystal plane 2001 of the torsion springs 204a and 204b is such that its crystal orientation parallel to a torsion axis 208 is a [111] orientation. The length of each torsion spring is 2000 μm, and a cross-sectional shape perpendicular to the torsion axis 208 is a rectangular shape having a width of 150 μm and a thickness of 100 μm.

A length of the movable portion 203 perpendicular to the torsion axis 208 is 1.5 mm, and a length thereof parallel to the torsion axis 208 is 1.0 mm. A thickness of the movable portion 103 is 0.1 mm. The movable portion 203 is produced using a single-crystal silicon substrate whose (111) plane is a principal plane. That is, a crystal orientation 2000 of the movable portion 203 is such that the crystal plane, which is the principal plane, of the movable portion 203 is a (111) plane. The movable portion 203 is produced by performing dry etching and photolithography of a semiconductor manufacturing method on the single-crystal silicon substrate whose (111) plane is the principal plane. The movable portion 203 may be formed by another method in which cutting is performed using a dicing blade (rotary blade). Although the movable portion and the torsion springs are integrated to each other with, for example, an adhesive, they may be integrated to each other other than by using an adhesive. For example, they may be integrated to each other by directly joining them to each other or by fusion.

When the members of the light deflector including, for example, the movable portion and the torsion springs are individually formed on a silicon wafer by a micromachining technology, unnecessary portions in the wafer can be reduced, so that usable portions can be increased. Therefore, costs can be reduced.

The resonant frequency of the light deflector is approximately 17.5 KHz. By virtue of this structure, even if processing errors in the widths of the torsion springs 204a and 204b are 1 μm, the torsion spring constant can be set at a substantially constant value. Therefore, an amount of change in the resonant frequency can be less than or equal to 1%.

FIG. 6 shows the results of calculation by the finite element method of how the deformation of the movable portion, caused by its own weight, changes with respect to each crystal orientation. In the calculations, the crystal anisotropy of silicon is considered. Physical property values, using the finite element method shown in FIG. 6, are similar to the physical property values using the calculation illustrated in FIG. 5.

The vertical axis of FIG. 6 represents the deformation amount ratio of the movable portion, and the horizontal axis represents the angle with respect to a [110] orientation. The deformation amount ratio of the movable portion is a ratio in which the deformation amount is 1 when the crystal plane of the principal plane of the movable portion is a (100) plane, and a crystal orientation parallel to the principal plane of the movable portion and perpendicular to the torsion axis is a [100] orientation (that is, the angle formed with respect to the [110] orientation is, for example, 45 degrees).

The angle formed with respect to the [110] orientation is formed between the [110] orientation, existing in the principal plane of the movable portion, and the crystal orientation perpendicular to the torsion axis. Therefore, when the crystal orientation parallel to the principal plane of the movable portion and perpendicular to the torsion axis is a [110] orientation, the angle formed with respect to the [110] orientation is 0 degrees.

Here, a (100) substrate represents that the crystal plane of the principal plane of the movable portion is a (100) plane. A (110) substrate and a (111) substrate can be similarly described. For example, for the (100) substrate, when the angles formed with respect to the [110] orientation are ±45 degrees and ±135 degrees, they represent the [100] orientation. When the angles formed with respect to the [110] orientation are 0 degrees, ±90 degrees, and ±180 degrees, they represent the [110] orientation. For the (110) substrate, the rotational angles of 0 degrees and ±180 degrees represent the [110] orientation. The rotational angle of ±90 degrees represents the [100] orientation, and the rotational angles of ±35.3 degrees and ±144.7 degrees represent the [111] orientation. For the (111) substrate, the rotational angles of 0 degrees and ±180 degrees represent the [110] orientation.

As shown in FIG. 6, the deformation amount of the movable portion, produced using the single-crystal silicon substrate having the (111) plane as the principal plane, is constant regardless of the crystal orientation. Therefore, when the movable portion is produced, even if the crystal orientation of the movable portion is shifted, the deformation amount of the movable portion can be made substantially constant. Consequently, variations in the deformation amount of the movable portion, caused by processing errors, can be reduced.

Therefore, by virtue of this structure, even if processing errors regarding the width of the torsion springs 204a and 204b occur, the torsion spring constant can be substantially constant. In addition, variations in the deformation of the movable portion, caused by processing errors, can be reduced.

Third Embodiment

Figure 3:
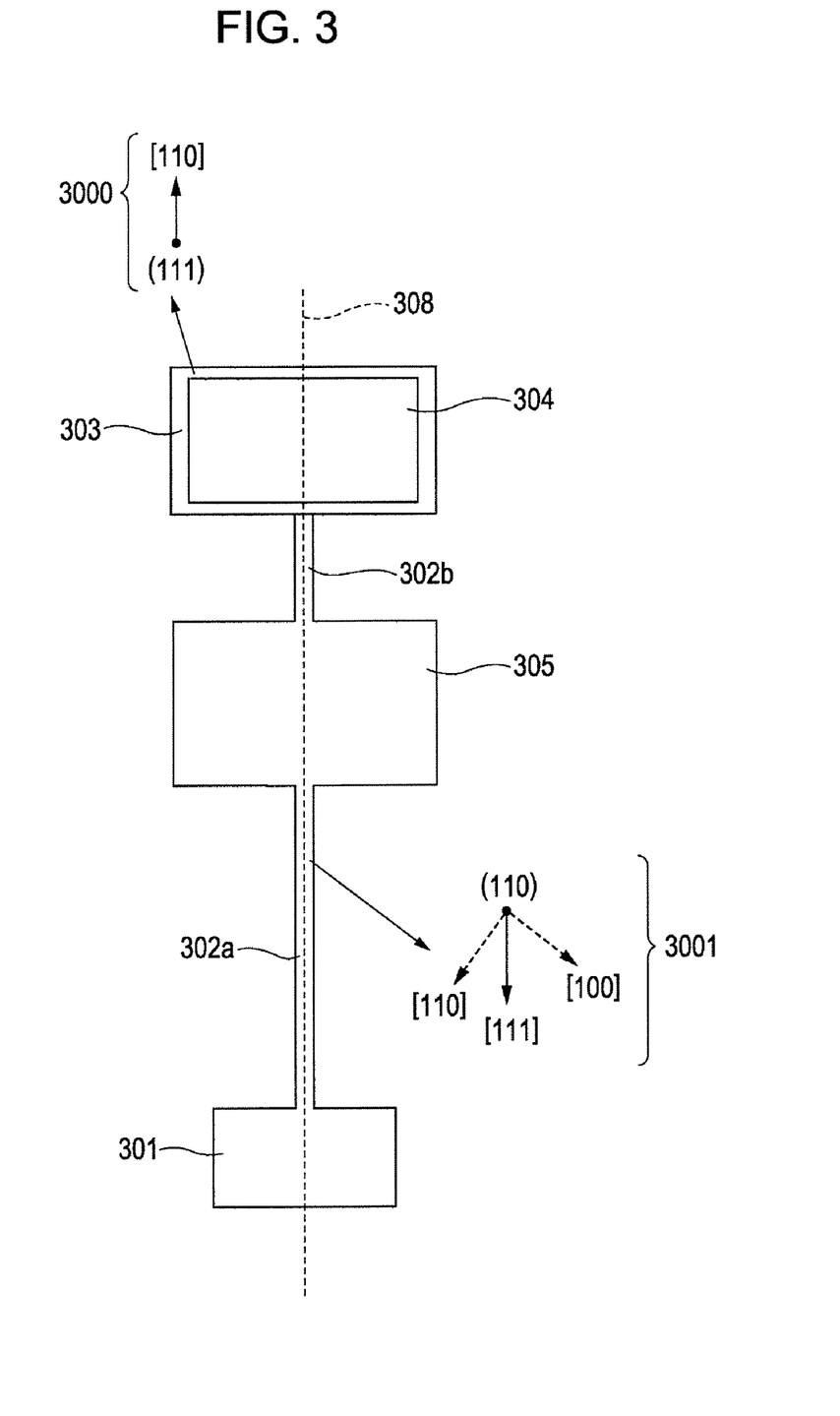
FIG. 3 is a top view of a light deflector according to a third embodiment of the present invention.

The structure of a light deflector according to the third embodiment will be described with reference to FIG. 3. The light deflector according to the third embodiment comprises two movable portions 303 and 305. The movable portion 303 has a reflecting surface 304. The movable portions 303 and 305 and a supporting portion 301 are connected to each other with a plurality of torsion springs 302a and 302b.

A length of the movable portion 303 perpendicular to a torsion axis 308 is 3.0 mm, and a size thereof parallel to the torsion axis 308 is 1.0 mm. A length of the movable portion 305 perpendicular to the torsion axis 308 is 3.0 mm, and a size thereof parallel to the torsion axis 308 is 1.0 mm. The movable portion 305 includes a permanent magnet (not shown), and can be driven by an electromagnetic force as in the first embodiment.

The torsion springs 302a and 302b are produced using a single-crystal silicon substrate whose (110) plane is a principal plane. As shown in FIG. 5, the torsion springs 302a and 302b are formed so that the crystal orientation parallel to the torsion axis 308 of the torsion springs 302a and 302b, which are micro torsion springs, is a [111] orientation.

In the light deflector according to the third embodiment, for the torsion vibration around the torsion axis 308 as a center, a first-order natural oscillation mode of a frequency $f_1$ and a second-order natural oscillation mode of a frequency $f_2$ that is substantially twice a reference frequency are provided. By torsional vibration in the first-order torsion vibration mode and the second-order torsion vibration mode at the same time, a displacement angle of deflection and scanning using light reflected by a reflecting surface 304 of the movable portion 303 is such that the two vibration modes are superimposed upon each other. Since the light deflector according to the third embodiment includes the first-order torsion vibration mode (serving as the reference frequency) and the second-order torsion vibration mode (whose frequency is substantially twice the reference frequency), the light deflector can be driven by a vibration having a sawtooth waveform. Therefore, the light scanning can be stably carried out with the light deflector having little variations in resonant frequency, the variations being caused by processing errors.

Fourth Embodiment

Figure 4:
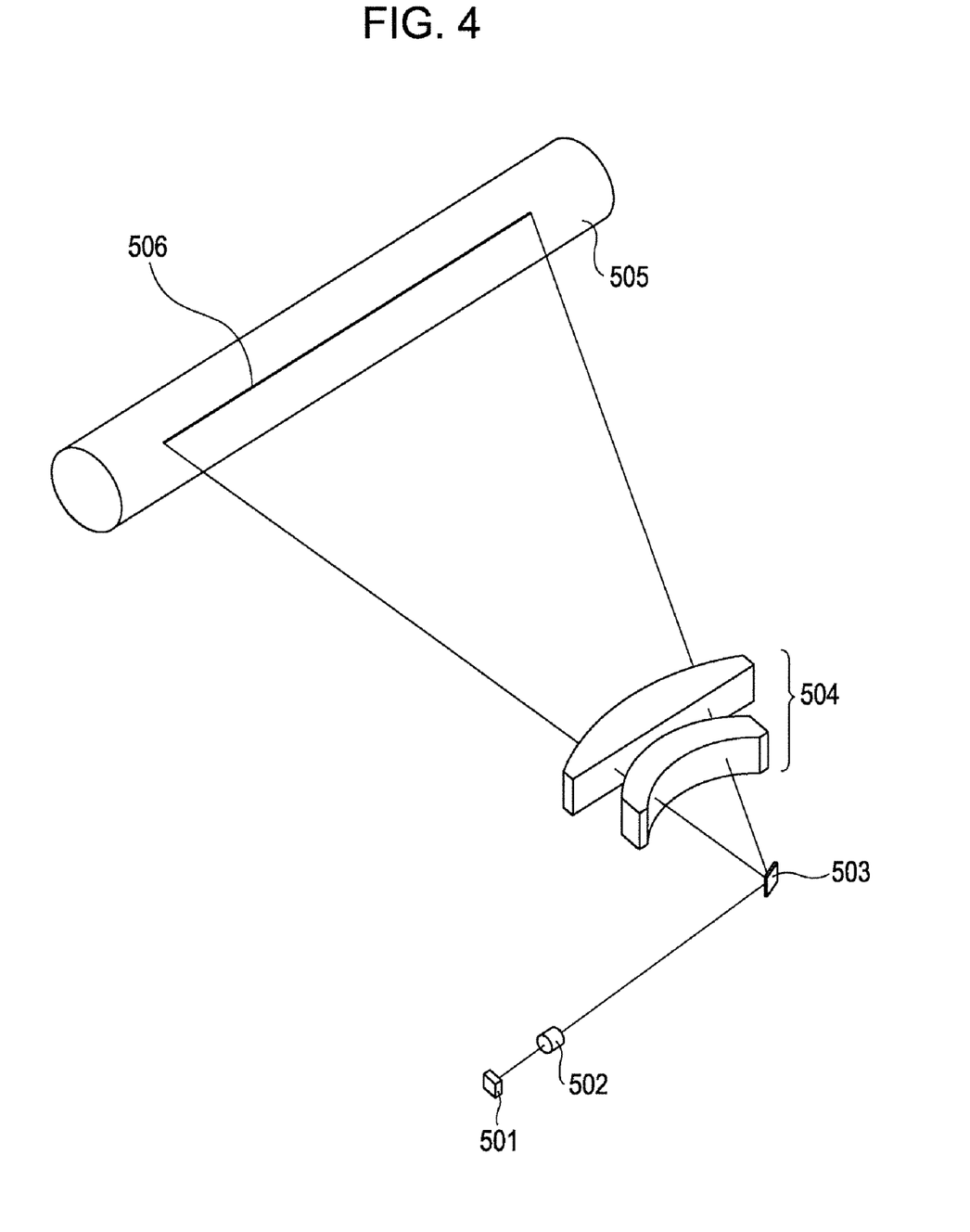
FIG. 4 shows an image forming apparatus according to a fourth embodiment of the present invention.

FIG. 4 shows an optical apparatus using the light deflector according to an embodiment of the present invention. FIG. 4 shows an image forming apparatus, which is an example optical apparatus. In FIG. 4, reference numeral 503 denotes the light deflector according to the present invention, and performs first-order scanning with incident light in the embodiment. Reference numeral 501 denotes a laser light source. Reference numeral 502 denotes a lens or a lens unit. Reference numeral 504 denotes a writing lens or a writing lens unit. Reference numeral 505 denotes a photosensitive member. Reference numeral 506 denotes a scanning locus. Laser light emitted from the laser light source 501 receives a predetermined intensity modulation related to a timing of the light deflection and scanning, so that the light deflector 503 performs one-dimensional scanning. The laser light used for the scanning passes through the writing lens 504, to form an image on the photosensitive member 505. The photosensitive member 505 is uniformly charged with a charger (not shown). The uniformly charged photosensitive member 505 is scanned with light, so that an electrostatic latent image is formed on the photosensitive member 505. Next, a developing unit (not shown) is used to form a toner image on the portion of the photosensitive member 505 where the electrostatic latent image is formed. The toner image is transferred onto/fixed to, for example, a sheet (not shown), so that an image is formed on the sheet. Using the light deflector in which variations in frequency, caused by processing errors, are reduced, a horizontal-to-vertical ratio of the image is stabilized, thereby making it possible to prevent deterioration in image quality.

When the light deflector according to the present invention is used in an image display apparatus, such as a projection display, it has the following structure. A light beam emitted from a light source that generates a light beam modulated on the basis of image data is deflected by the light deflector according to the present invention, and an irradiation object is irradiated with the light beam, to form an image. The light deflector is formed so as to be capable of deflecting the light beam in a main scanning direction and a sub scanning direction on the irradiation object.

As described above, the light deflector according to the present invention is applicable to such an optical apparatus.

The present invention relates to an oscillating device, a light deflector, and an image forming apparatus using the same. For example, the light deflector is suitable for use in a projection display, which projects an image by light deflection and scanning, and in an image forming apparatus, such as a digital copying apparatus or a laser beam printer using an electrophotography process.

While the present invention has been described with reference to exemplary embodiments, it is to be understood that the invention is not limited to the disclosed exemplary embodiments. The scope of the following claims is to be accorded the broadest interpretation so as to encompass all modifications and equivalent structures and functions.

This application claims the benefit of Japanese Patent Application No. 2007-197394 filed Jul. 30, 2007, which is hereby incorporated by reference herein in its entirety.

What is claimed is:

1. An oscillating device comprising:
a supporting portion;
a movable portion;
a torsion spring that supports the movable portion with respect to the supporting portion so that the movable portion is capable of torsionally vibrating around a torsion axis; and
a driving unit that vibrates the movable portion,
wherein the torsion spring is formed of single-crystal silicon, and
wherein an orientation of the torsion axis of the torsion spring is parallel to a [111] crystal orientation.

2. The oscillating device according to claim 1, wherein the movable portion is formed of the single-crystal silicon, and a crystal plane of a principal plane of the movable portion is a (111) plane.

3. The oscillating device according to claim 1, wherein the supporting portion, the movable portion, and the torsion spring are integrally formed using the single-crystal silicon.

4. A light deflector comprising:
the oscillating device according to claim 1; and
a reflecting surface provided at the movable portion.

5. The light deflector according to claim 4, wherein a plurality of the movable portions and a plurality of the torsion springs are provided, the plurality of torsion springs supporting the plurality of the movable portions so that the plurality of the movable portions are capable of torsionally vibrating around a same torsion axis,
wherein at least one of the plurality of movable portions has the reflecting surface, and
wherein a natural frequency that is a reference frequency and a natural frequency that is an integral multiple of the reference frequency are provided around the torsion axis.

6. An image forming apparatus comprising:
a light source;
the light deflector according to claim 4; and
a photosensitive member,
wherein the light deflector deflects light from the light source, and causes the photosensitive member to be irradiated with at least a portion of the light, to form an electrostatic latent image.

* * * * *